(12) United States Patent
Ellis-Monaghan et al.

(10) Patent No.: US 6,936,910 B2
(45) Date of Patent: Aug. 30, 2005

(54) BICMOS TECHNOLOGY ON SOI SUBSTRATES

(75) Inventors: John Joseph Ellis-Monaghan, Grand Isle, VT (US); Alvin Jose Joseph, Williston, VT (US); Qizhi Liu, Williston, VT (US); Kirk David Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,743

(22) Filed: Mar. 23, 2004

(65) Prior Publication Data

US 2004/0222486 A1 Nov. 11, 2004

Related U.S. Application Data

(63) Continuation-in-part of application No. 10/249,819, filed on May 9, 2003.

(51) Int. Cl.$^7$ .............................................. H01L 29/00
(52) U.S. Cl. ....................... 257/552; 257/556; 257/347; 438/309; 438/205; 438/313
(58) Field of Search ................................ 257/552, 556, 257/347, 510–522, 565; 438/309, 205, 313, 34

(56) References Cited

U.S. PATENT DOCUMENTS

| | | |
|---|---|---|
| 3,974,560 A | 8/1976 | Mueller et al. |
| 4,016,596 A | 4/1977 | Magdo et al. |
| 4,567,645 A | 2/1986 | Cavanagh et al. |
| 5,102,809 A | 4/1992 | Eklund et al. |
| 5,252,143 A | 10/1993 | Chiang et al. |
| 5,279,978 A | 1/1994 | See et al. |
| 5,371,401 A | 12/1994 | Kurita et al. |
| 5,521,399 A | 5/1996 | Chu et al. |
| 5,523,606 A | 6/1996 | Yamazaki |
| 5,583,059 A | 12/1996 | Burghartz et al. |
| 5,620,908 A | 4/1997 | Inoh et al. |
| 6,004,865 A | 12/1999 | Horiuchi et al. |
| 6,107,125 A | 8/2000 | Jaso et al. |
| 6,121,102 A | 9/2000 | Norstrom et al. |
| 6,232,649 B1 | 5/2001 | Lee |
| 6,251,751 B1 | 6/2001 | Chu et al. |
| 6,303,419 B1 | 10/2001 | Chang et al. |
| 6,313,012 B1 * | 11/2001 | Horiuchi et al. ............ 438/459 |
| 6,365,935 B1 | 4/2002 | Zhang et al. |
| 6,479,868 B1 | 11/2002 | An et al. |
| 6,492,238 B1 | 12/2002 | Ahlgren et al. |
| 6,528,378 B2 | 3/2003 | Hirata et al. |
| 6,653,714 B2 | 11/2003 | Matsuno et al. |
| 2001/0023947 A1 | 9/2001 | Gutierrez-Aitken et al. |
| 2003/0105066 A1 | 6/2003 | Pierson, Jr. et al. |

* cited by examiner

*Primary Examiner*—Fetsum Abraham
(74) *Attorney, Agent, or Firm*—Scully, Scott, Murphy & Presser; Anthony J. Canale

(57) ABSTRACT

A method and a BICMOS structure are provided. The BiCMOS structure includes an SOI substrate having a bottom Si-containing layer, a buried insulating layer located atop the bottom Si-containing layer, a top Si-containing layer atop the buried insulating layer and a sub-collector which is located in an upper surface of the bottom Si-containing layer. The sub-collector is in contact with a bottom surface of the buried insulating layer. The structure also includes an extrinsic base heterojunction bipolar transistor located in an opening provided in a bipolar device area of the SOI substrate in which a base region of the bipolar transistor is located directly atop the sub-collector

29 Claims, 12 Drawing Sheets

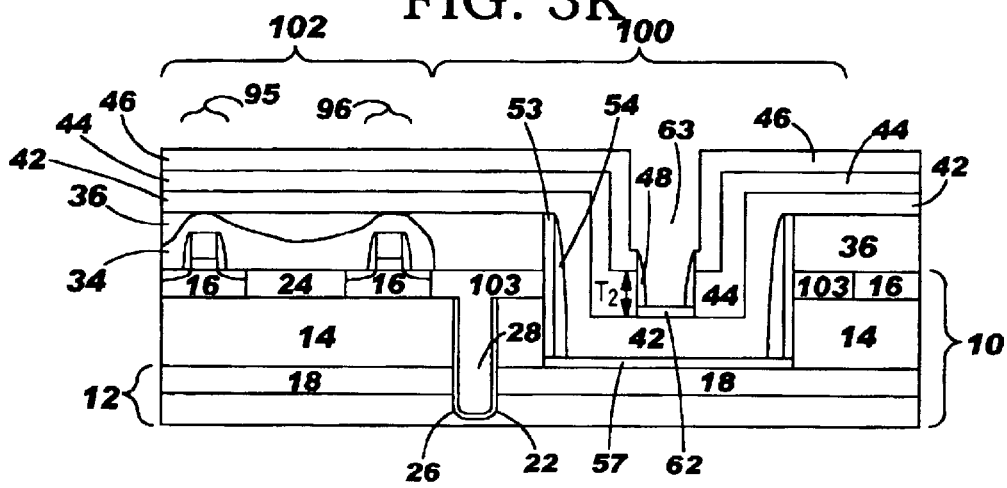
FIG. 3K
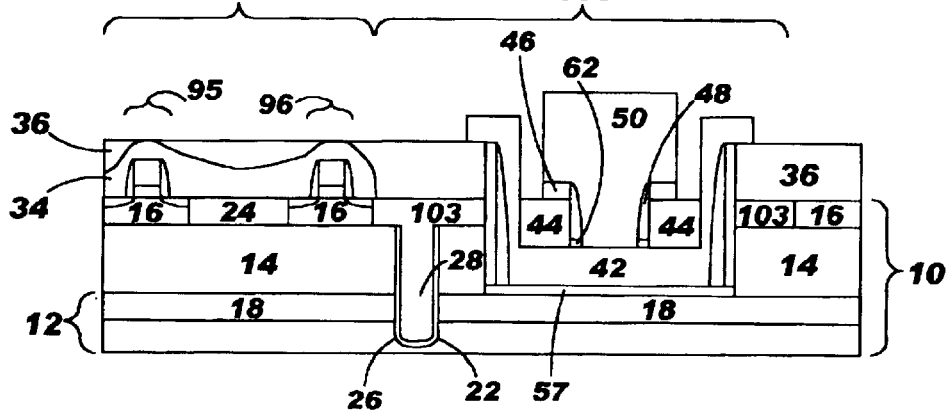
FIG. 3L
FIG. 3M
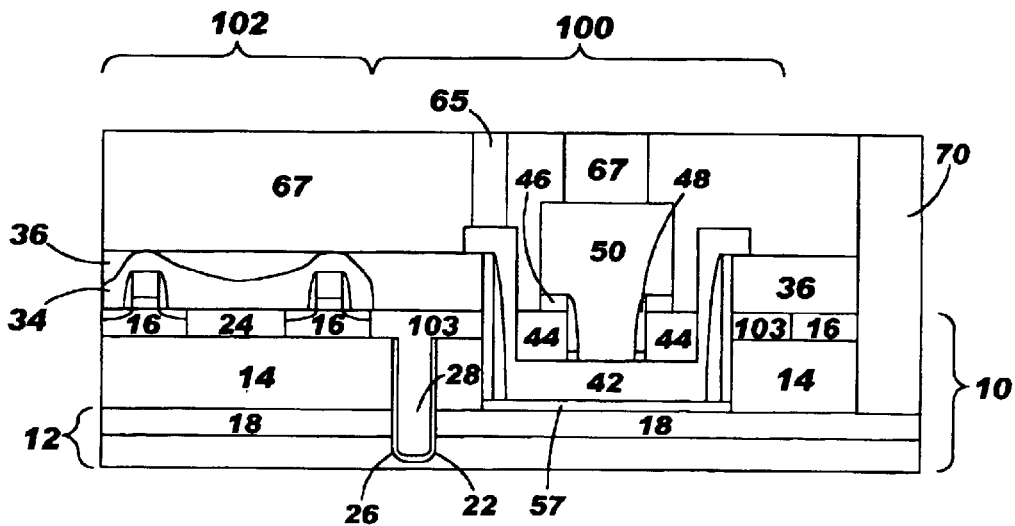

BICMOS TECHNOLOGY ON SOI SUBSTRATES

CROSS REFERENCE TO RELATED APPLICATIONS

This application is a continuation-in-part of U.S. patent application Ser. No. 10/249,819 entitled BiCMOS TECHNOLOGY ON SOI SUBSTRATES, filed May 9, 2003, the entire content and subject matter of which are incorporated herein by reference.

BACKGROUND OF INVENTION

1. Field of the Invention

The present invention relates to integrated bipolar and complementary metal oxide semiconductor (BiCMOS) devices using silicon-on-insulator (SOI) technology in which the bipolar transistors and the CMOS transistors are fabricated on different surface layers of the SOI substrate. The present invention also provides a method for forming the BiCMOS devices. The structure and method of the present invention overcome topographic challenges as well as providing different surface layers in the SOI substrate for fabricating the various devices present in BiCMOS technology.

2. Background of the Invention

Bipolar transistors are electronic devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology uses a SiGe base in the heterojunction bipolar transistor. In the high-frequency (such as multi-GHz) regime, conventional compound semiconductors such as GaAs and InP currently dominate the market for high-speed wired and wireless communications. SiGe BiCMOS promises not only a comparable performance to GaAs in devices such as power amplifiers, but also a substantial cost reduction due to the integration of heterojunction bipolar transistors with standard CMOS, yielding the so-called "system on a chip."

For high-performance HBT fabrication, yielding SiGe/Si HBTs, a conventional way to reduce the base resistance is through ion implantation onto the extrinsic base. The ion implantation will cause damage, however, to the base region. Such damage may ultimately lead to degradation in device performance.

To avoid the implantation damage, a raised extrinsic base (Rext) is formed by depositing an extra layer of polycrystalline silicon atop the conventional SiGe extrinsic base layer. There are essentially two processes that may be applied to achieve such a raised extrinsic base. The first process involves selective epitaxy; the other involves chemical-mechanical polishing (CMP).

In a typical selective epitaxy process, the raised extrinsic base polycrystalline silicon is formed before the deposition of the intrinsic base SiGe. The intrinsic base SiGe is deposited selectively onto the exposed surface of silicon and polycrystalline silicon inside an over-hanging cavity structure. The selective epitaxy with a cavity structure mandates stringent process requirements for good selectivity, and suffers from poor process control. U.S. Pat. No. 5,523,606 to Yamazaki and U.S. Pat. No. 5,620,908 to Inoh, et al. are some examples of prior art selective epitaxy processes.

In addition to selective epitaxy, a raised extrinsic base may be formed by utilizing a CMP process. However, when it comes to SiGe BiCMOS structures, there is a topographic issue for CMP since the CMOS gate creates a thickness difference, which is similar to the gate height (typically 100–250 nm), between the CMOS device area and the bipolar transistor device area. The height of these two device areas must be adjusted to the same level for the raised extrinsic base CMP.

In addition to selective epitaxy, a raised extrinsic base may be formed by utilizing a CMP process. However, when it comes to SiGe BiCMOS structures, there is a topographic issue for CMP since the CMOS gate creates a thickness difference, which is similar to the gate height (typically 100–250 nm), between the CMOS device area and the bipolar transistor device area. The height of these two device areas must be adjusted to the same level for the raised extrinsic base CMP.

In one prior art process; see, for example, U.S. Pat. No. 6,492,238, a BiCMOS having a raised extrinsic base region is formed using a reactive-ion etch (RIE) step to etch part of the film on top of the CMOS gate to make the CMOS transistor and bipolar transistor device areas substantially level. Despite being capable of leveling the two device areas, this prior art approach for adjusting the height differential between the HBT and the CMOS transistor device areas is complicated and requires two additional lithographic levels to achieve leveling between the device areas of the CMOS transistor and the HBT. In addition to the topography challenges in integrating bipolar devices with CMOS devices, there is an ongoing trend in the semiconductor industry for replacing bulk Si technology with SOI technology since SOI permits the formation of high-speed integrated circuits. In SOI technology, a buried insulating layer electrically isolates a top Si-containing layer from a bottom Si-containing layer. The top Si-containing layer, which is oftentimes referred to in the art as the SOI layer, is generally the area in which active devices such as transistors are formed. Devices formed using SOI technology offer many advantages over their bulk Si counterparts including, for example, higher performance, absence of latch-up, higher packing density and low voltage applications. The replacement of bulk Si substrates with SOI is also occurring in BiCMOS devices. In most BiCMOS/SOI structures, the topography challenge mentioned above would also be present.

U.S. Pat. No. 6,232,649 to Lee discloses a process for fabricating a bipolar transistor on an SOI substrate which includes etching a bipolar transistor area into a bottom Si-containing layer of an SOI substrate; in the patented prior art process the etching goes through the top Si-containing layer, the buried insulating layer and an upper surface of the bottom Si-containing layer, stopping somewhere below this upper surface. Despite being capable of fabricating a bipolar transistor on an SOI substrate, this prior art approach needs a selective epitaxial silicon growth process which mandates stringent process requirements for good selectivity, and suffers from poor process control. Moreover, the form factor of the entire prior art bipolar transistors inherently lacks the compactness of the state-of-the art bipolar transistors in advanced BiCMOS technologies, e.g., the entire base region is separated from the collector by oxide sidewalls. This makes it difficult to reduce the product of base-collector capacitance and collector resistance, which is critical to enable fast bipolar transistors.

In addition, the etching used in Lee to form polysilicon sidewalls to connect the buried collectors etches directly into the Si where the buried collector is formed. Not only does this etch create damage in Si, rendering defective epitaxial base layer later on, but also it is not controllable; therefore the depth of the trenches for bipolar transistors formed into the SOI substrate may vary from one area to another as well as vary across a single SOI wafer. This results in a topography problem with each bipolar transistor being formed using technology such as disclosed in Lee.

Another challenge facing BiCMOS device fabrication is that different devices present on the same chip have different substrate requirements. For example, when passive elements such as inductors are present on BiCMOS integrated circuits, it is typically required that the passive elements be formed atop substrates that are highly resistive. A high-resistivity substrate is necessary for high quality factor, high-Q, inductors isolated between digital and analog parts of the circuit.

In view of the state of the art mentioned above, there is a continued need for providing BiCMOS devices that have improved topography between the CMOS device area and the bipolar device area in which SOI technology is used. Additionally, there is a need for being able to tailor portions of the SOI substrate for fabricating passive elements of high quality on the same chip as the bipolar transistors and the CMOS transistors.

SUMMARY OF INVENTION

One object of the present invention is to provide a simple, yet reliable method of fabricating a high-performance HBT in an integrated BiCMOS process in which the topography between the HBT device area and the CMOS device area is substantially the same.

Another object of the present invention is to provide a method of integrating BiCMOS technology with SOI technology such that the BiCMOS devices are formed on different surface layers of a single SOI substrate.

A yet further object of the present invention is to provide a method of forming a BiCMOS structure having passive devices located on a portion of the SOI substrate that are adjacent to either the HBT device area or the CMOS device area in which the portion of the SOI substrate containing the passive devices has been altered to achieve a high quality factor, high-Q.

These and other objects and advantages are achieved in the present invention by utilizing a method in which the HBT is built in an area in which the top Si-containing and the buried insulating layer of an SOI substrate have been selectively etched. That is, in the present invention, the HBT is built directly atop an upper surface of a bottom Si-containing layer of an SOI substrate. The inventive method thus decouples the substrate for the CMOS transistors and the HBTs. An optional proton ion implant step can be performed in areas of the SOI substrate that are periphery to either the HBT device area or the CMOS device area to increase the substrate resistance for subsequent formation of a high-Q inductor.

One aspect of the present invention relates to a method of forming BiCMOS devices, i.e., high-performance HBTs and CMOS transistors, on an SOI substrate. Specifically, and in broad terms, the method of the present invention comprises the steps of:

providing an SOI structure having a bottom Si-containing layer, a buried insulating layer located atop the bottom Si-containing layer, a top Si-containing layer atop the buried insulating layer and a sub-collector which is formed in an upper surface of the bottom Si-containing layer, the sub-collector is in direct contact with a bottom surface of the buried insulating layer;

selectively removing portions of the top Si-containing layer and the buried insulating layer stopping atop the sub-collector so to define an area for fabricating a heterojunction bipolar transistor; and forming an extrinsic base heterojunction bipolar transistor in said area in which a base region of the transistor is formed directly atop the sub-collector.

In some embodiments of the present invention, portions of the SOI substrate that lay in the periphery of the extrinsic base heterojunction bipolar transistor are subjected to a proton ion implant step, which increases the resistance of the SOI substrate to provide areas for fabricating inductors having a high-Q factor.

In another embodiment of the present invention, the portion of the upper silicon-containing layer is removed from the region of the SOI substrate in which the bipolar device is subsequently formed and is replaced with an insulating material. The insulating material defines the bipolar region of the substrate. This method of the present invention, can reduce the number of masking steps utilized to provide a heterojunction bipolar device. In broad terms, this method of the present invention includes:

providing an SOI structure having a bottom Si-containing layer, a buried insulating layer located atop the bottom Si-containing layer, a top Si-containing layer atop the buried insulating layer and a sub-collector which is formed in an upper surface of the bottom Si-containing layer, the sub-collector is in direct contact with a bottom surface of the buried insulating layer;

selectively removing the top Si-containing layer from a portion of the SOI structure to provide a bipolar opening, the bipolar opening exposing the buried insulating layer;

depositing a bipolar dielectric within the bipolar opening, wherein the bipolar dielectric is positioned atop the buried insulating layer;

selectively removing portions of the bipolar dielectric and the buried insulating layer stopping atop the sub-collector so to define an area for fabricating a heterojunction bipolar transistor; and forming an extrinsic base heterojunction bipolar transistor in the area in which a base region of the transistor is formed directly atop the sub-collector.

Another aspect of the present invention relates to a BiCMOS structure, which is built on an SOI substrate. Specifically, the BiCMOS structure of the present invention comprises:

an SOI substrate having a bottom Si-containing layer, a buried insulating layer located atop the bottom Si-containing layer, a top Si-containing layer atop the buried insulating layer and a sub-collector which is located in an upper surface of the bottom Si-containing layer, said sub-collector is in contact with a bottom surface of the buried insulating layer; and an extrinsic base heterojunction bipolar transistor located in an opening provided in a bipolar device area of the SOI substrate in which a base region of the bipolar transistor is located directly atop the sub-collector.

The BiCMOS structure of the present invention further includes a CMOS transistor, i.e., field effective transistor, which is located adjacent to, but isolated from the bipolar transistor. The FET is formed within and atop the top Si-containing layer of the SOI substrate.

In some embodiments, passive elements such as inductors are located in other portions of the SOI substrate that are periphery to the bipolar transistor. In such an embodiment, at least the top Si-containing layer and portions of the bottom Si-containing layer have been subjected to a proton ion implantation step so as to provide a high resistivity region in the substrate that lies beneath the passive elements.

BRIEF DESCRIPTION OF DRAWINGS

FIGS. 3A–3M are pictorial representations (through cross sectional views) illustrating the basic processing steps of a second embodiment of the present invention, in which a portion of the upper Si-containing layer of the SOI substrate is replaced with an insulating layer that defines the bipolar region of the substrate

DETAILED DESCRIPTION

Figure 1A:
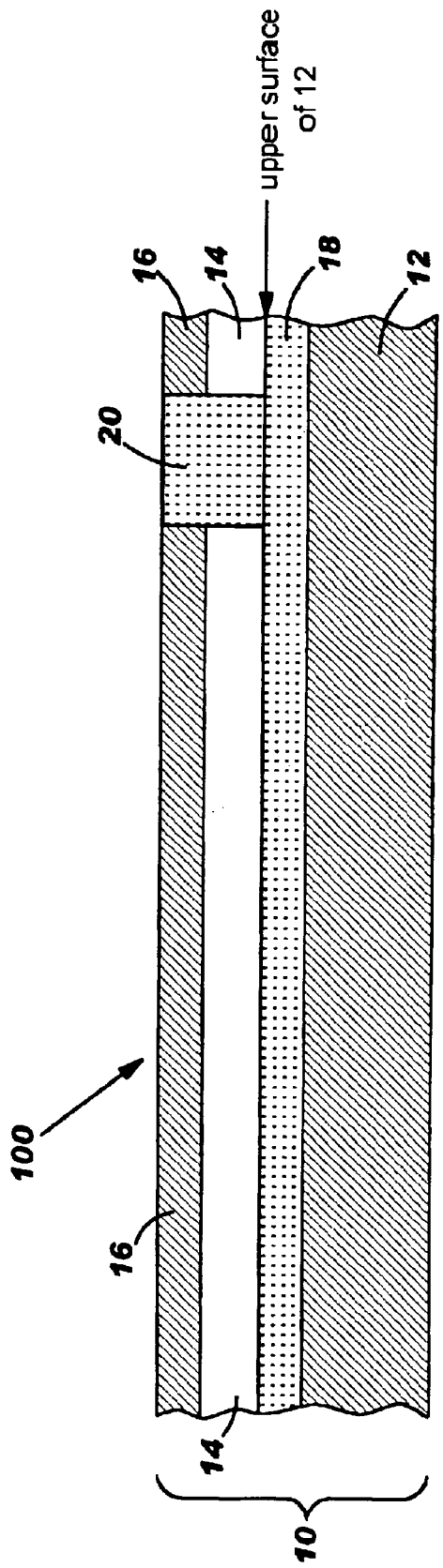
FIGS. 1A–1G are pictorial representations (through cross sectional views) illustrating the basic processing steps of the present invention.

The present invention, which provides a method of integrating, BiCMOS technology with SOI technology, will now be described in greater detail by referring to the drawings that accompany the present application. The drawings shown in FIGS. 1A–1G only depict the HBT device area 100. For clarity, the CMOS device areas as well as the other areas of a typical BiCMOS structure are not shown in FIGS. 1A–1G. In FIG. 2 of the present application, an HBT device area 100, a CMOS device area 102 and a passive device area 104 are shown. FIGS. 3A–3M depict the HBT device area 100 and the CMOS device area 102.

Reference is first made to the initial structure shown in FIG. 1A; the bipolar device region 100 is shown; the CMOS device region 102 and the passive device region 104 are not shown for clarity. Despite not being shown, the CMOS device region and the passive device region would lay to the periphery of the bipolar device region 100 shown in FIGS. 1A–1G. Although a single bipolar device region 100 is shown, a plurality of such device regions can be present on the SOI substrate 10.

The initial structure shown in FIG. 1A comprises an SOI substrate 10 having a sub-collector region 18 and a reach-though implant region 20 located within the SOI substrate 10. The SOI substrate 10 includes a bottom Si-containing layer 12, a buried insulating layer 14, such as an oxide, located atop the bottom Si-containing layer 12, and a top Si-containing layer 16 located atop the buried insulating layer 14. The term "Si-containing layer" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., a:Si, and multilayers thereof. A preferred Si-containing material for Si-containing layers 12 and 16 is Si.

The top Si-containing layer 16 of SOI substrate 10 has a vertical thickness, $t_v$, i.e., height, of less than about 300 nm, with a vertical thickness of from about 50 nm to about 100 nm being more highly preferred. The thickness of the buried insulating layer 14 may vary, but typically, buried insulating layer 14 has a thickness of less than about 350 nm, with a thickness of from about 100 to about 200 nm being more highly preferred. The thickness of the bottom Si-containing layer 12 is inconsequential to the present invention.

The SOI substrate 10 is fabricated using techniques that are well known to those skilled in the art. For example, the SOI substrate 10 may be fabricated using a thermal bonding process, or alternatively the SOI substrate 10 may be fabricated by an ion implantation process which is referred to in the art as separation by ion implantation of oxygen (SIMOX). When a thermal bonding process is employed in fabricating the SOI substrate 10, an optional thinning step may be utilized to thin the top Si-containing layer 16 into an ultra-thin regime, which is on the order of less than 50 nm.

Sub-collector 18 is formed either during the above-mentioned process of fabrication of the SOI substrate or into the SOI substrate 10 utilizing implantation conditions that are capable of implanting n-type or p-type dopants into the SOI substrate 10 such that the upper surface of the sub-collector 18 abuts or is close to the lower surface of the buried insulating layer 14. The exact implant conditions for sub-collector formation may vary depending on the type of dopant employed. The implant conditions are well known and are within knowledge of one skilled in the art. In a preferred embodiment, the sub-collector 18 is a n-type sub-collector which has been formed by ion implanting an ntype dopant such as phosphorus into the SOI substrate using an ion dose of from about $10^{14}$ to about $10^{16}$ atoms/$cm^2$ and an implant energy of from about 50 to about 500 keV. The implant may be performed using a masked or maskless process.

A reach-through region is then defined in the SOI substrate 10 by first forming a material stack (not shown) on the upper surface of the SOI substrate 10, i.e., atop the Si-containing layer 16. The material stack includes at least a bottom masking layer such as $SiO_2$, and a top CMP (chemical mechanical polishing) stop layer such as SiN which is formed utilizing conventional techniques well known to those skilled in the art. For example, the $SiO_2$ masking layer may be formed by a thermal oxidation process, or alternatively it may be formed by a deposition process such as chemical vapor deposition (CVD). The CMP stop layer is formed by a conventional deposition process such as CVD.

A photoresist mask (not shown) is next applied to the material stack and the photoresist mask is subjected to lithography which includes the steps of exposing the photoresist to a pattern of radiation and developing the pattern into the exposed photoresist mask using a resist developer. The pattern is then transferred through the masking layer, the top Si-containing layer 16, the buried insulating layer 14 stopping atop the sub-collector region 18. The patterned photoresist is removed utilizing a conventional stripping process and the trench thus formed is filled with doped Si (either n+ or p+) utilizing a conventional in-situ doping deposition process or a deposition process followed by dopant implantation to provide a reach through region 20. The dopant type of the reach through region 20 depends on the dopant type of the sub-collector 18; specifically, the sub-collector 18 and the reach through region 20 are of the same dopant type. Following trench fill, the structure is planarized utilizing a planarization process such as CMP or grinding stopping on the CMP stop layer of the masking layer. The CMP stop layer and the masking layer are then removed utilizing selective etching processes.

Figure 1B:
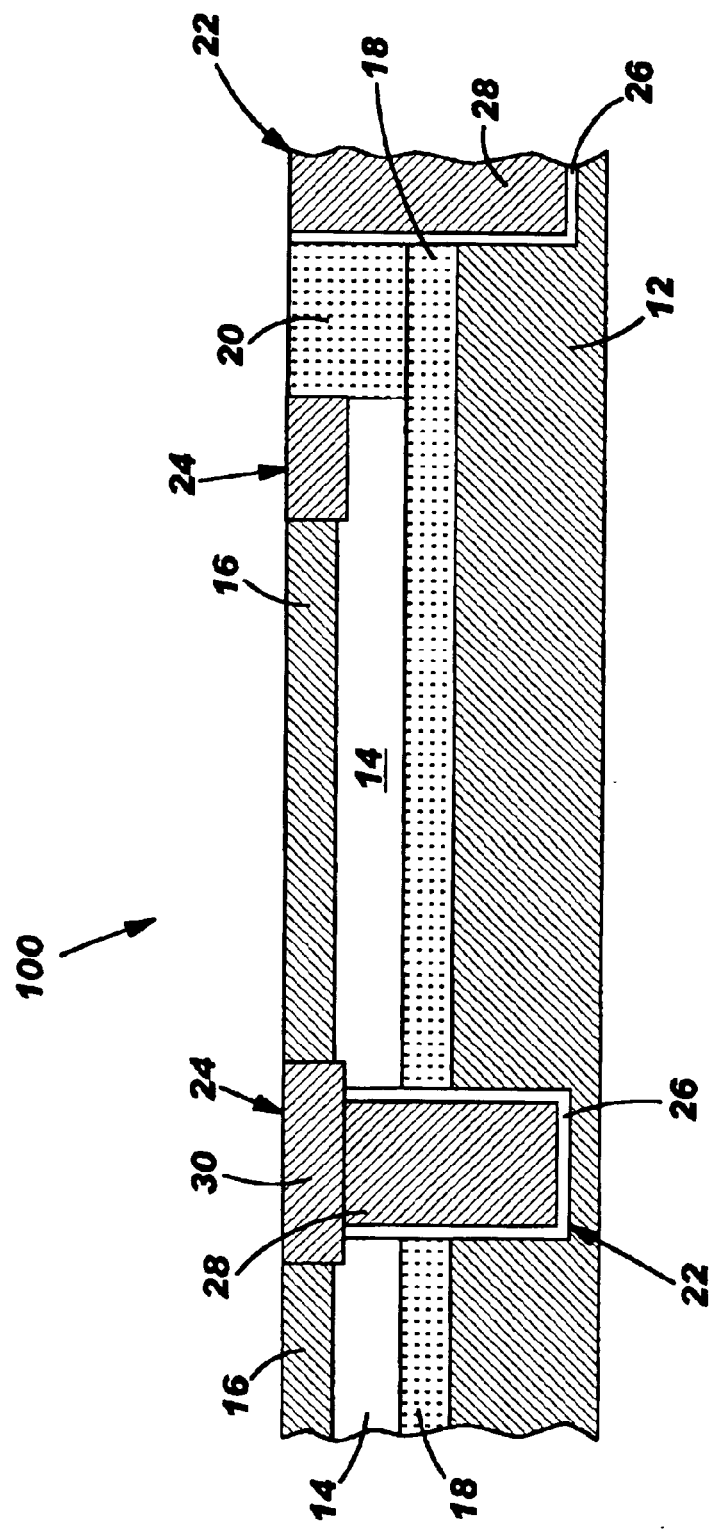
Figure 2:
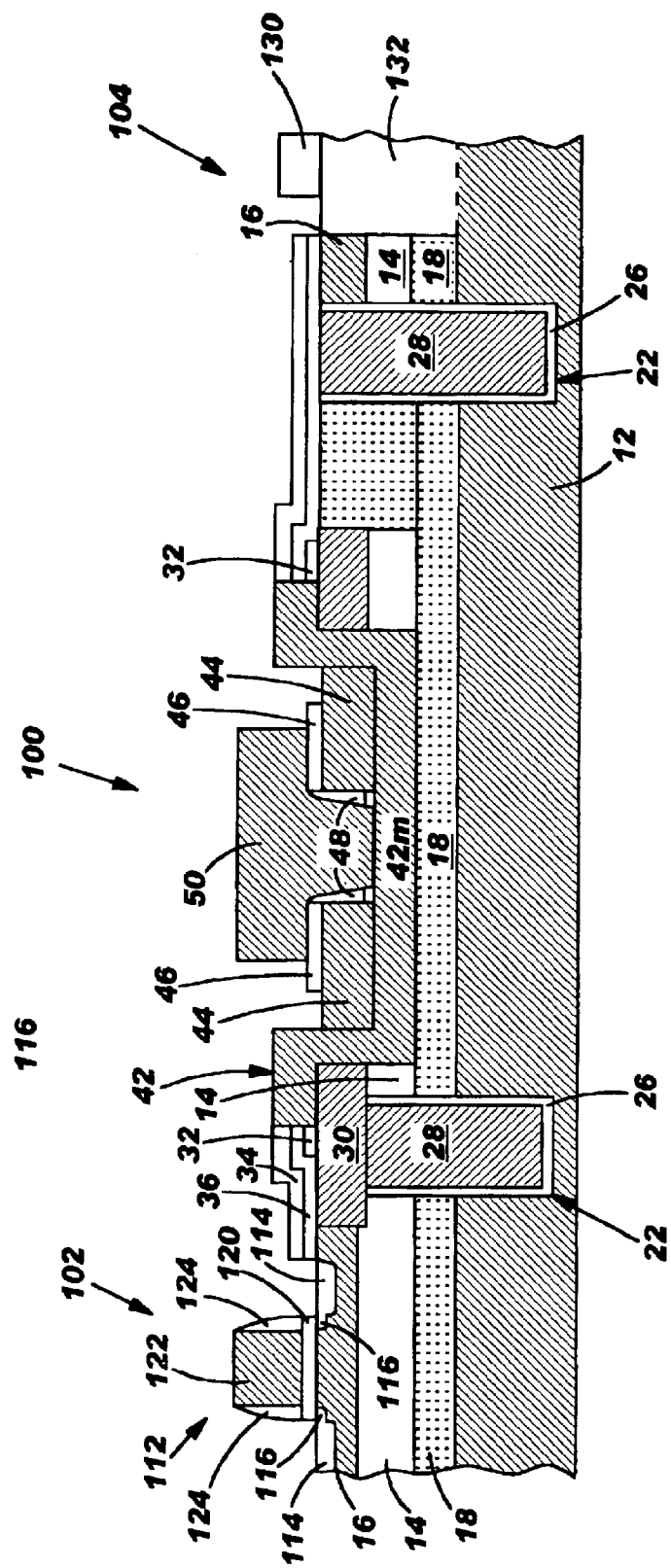
FIG. 2 is a pictorial representation (through a cross sectional view) illustrating a BiCMOS structure of the present invention, including a CMOS transistor, a HBT, and an optional area of the SOI substrate that has been subjected to proton ion implantation.

The above process steps result in the formation of the initial structure shown in FIG. 1A. After providing the initial structure shown in FIG. 1A, isolation regions are formed into the initial structure. FIG. 1B illustrates a structure that includes a pair of deep trench isolation regions 22, and a pair of shallow trench isolation regions 24. Although the drawings show the formation of two deep trench isolation regions and two shallow trench isolation regions any number or combination of such isolation regions is possible.

The isolation regions are formed by providing photoresist masks (not shown) atop the structure shown in FIG. 1A and then subjecting the photoresist masks to lithography to define the desired isolation trench pattern. The isolation trench pattern is then transferred into the structure by utilizing a dry etching process such as reactive-ion etching, ion beam etching, plasma etching or laser ablation. The deep trench isolation (DTI) regions 22 are typically formed prior to the shallow trench isolation (STI) regions 24. The deep trenches are etched to a depth of from about 500 to about 6000 nm below the upper surface of the initial structure shown in FIG. 1A, while shallow trenches are etched to a depth of the full thickness of the top Si-containing layer 16 in the initial structure shown in FIG. 1A. The DTIs 22 typically having a higher aspect ratio than the STIs 24.

In the case of the deep trenches, after etching the deep trenches, the patterned mask used in defining the deep trenches are removed and then the deep trenches are lined via deposition or oxidation with an oxide liner 26, such as tetraethylorthosilicate (TEOS), and filled with a trench fill material 28, such as polySi. After trench fill, which is achieved utilizing a deposition process such as CVD or plasma-CVD, the structure may be subjected to a planarization process. In some embodiments, the deep trench dielectric 28 may be densified after planarization.

The shallow trenches are typically formed using another patterned photoresist mask having a shallow trench pattern formed therein. Etching is employed to transfer the shallow trench pattern into the structure and thereafter the shallow trenches are filled with a trench dielectric material 30 such as TEOS or high-density-plasma (HDP) oxide. Planarization and densification may follow the shallow trench filling step.

Figure 1C:
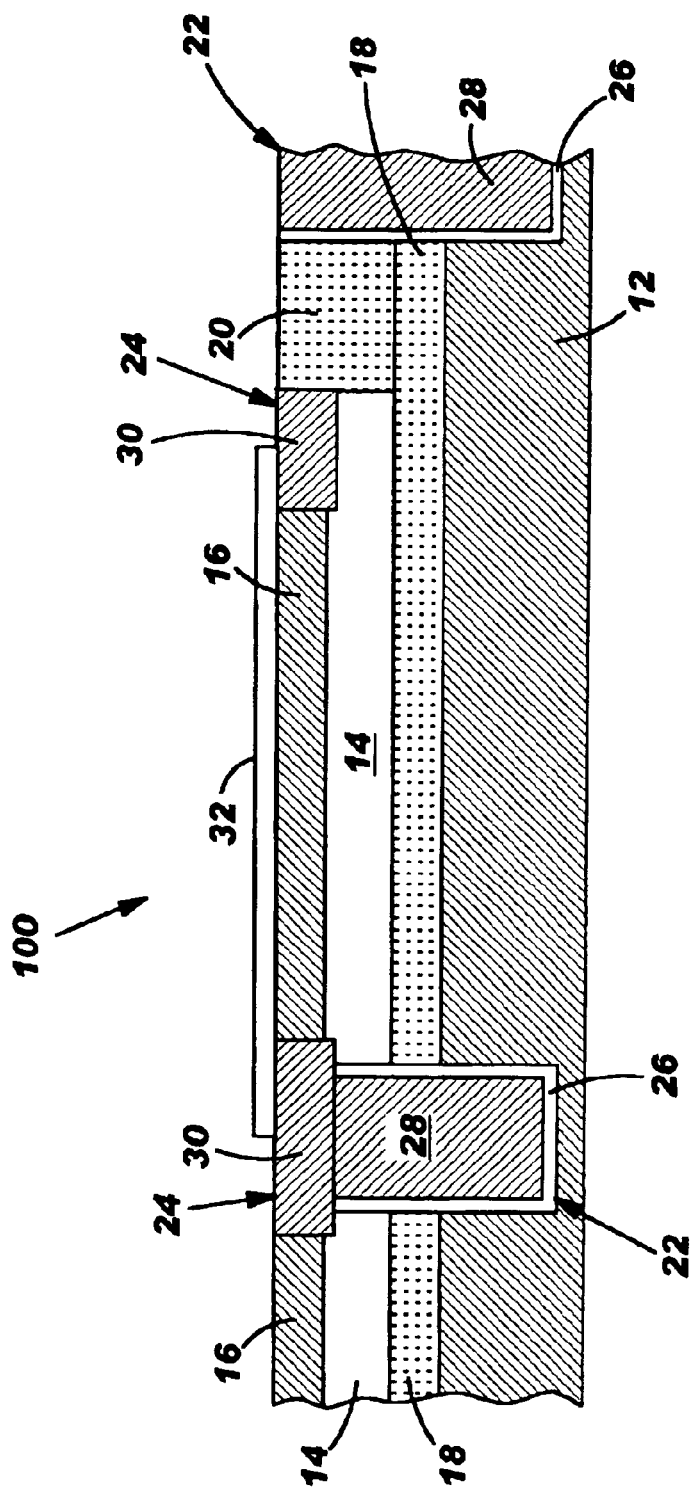
Figure 1D:
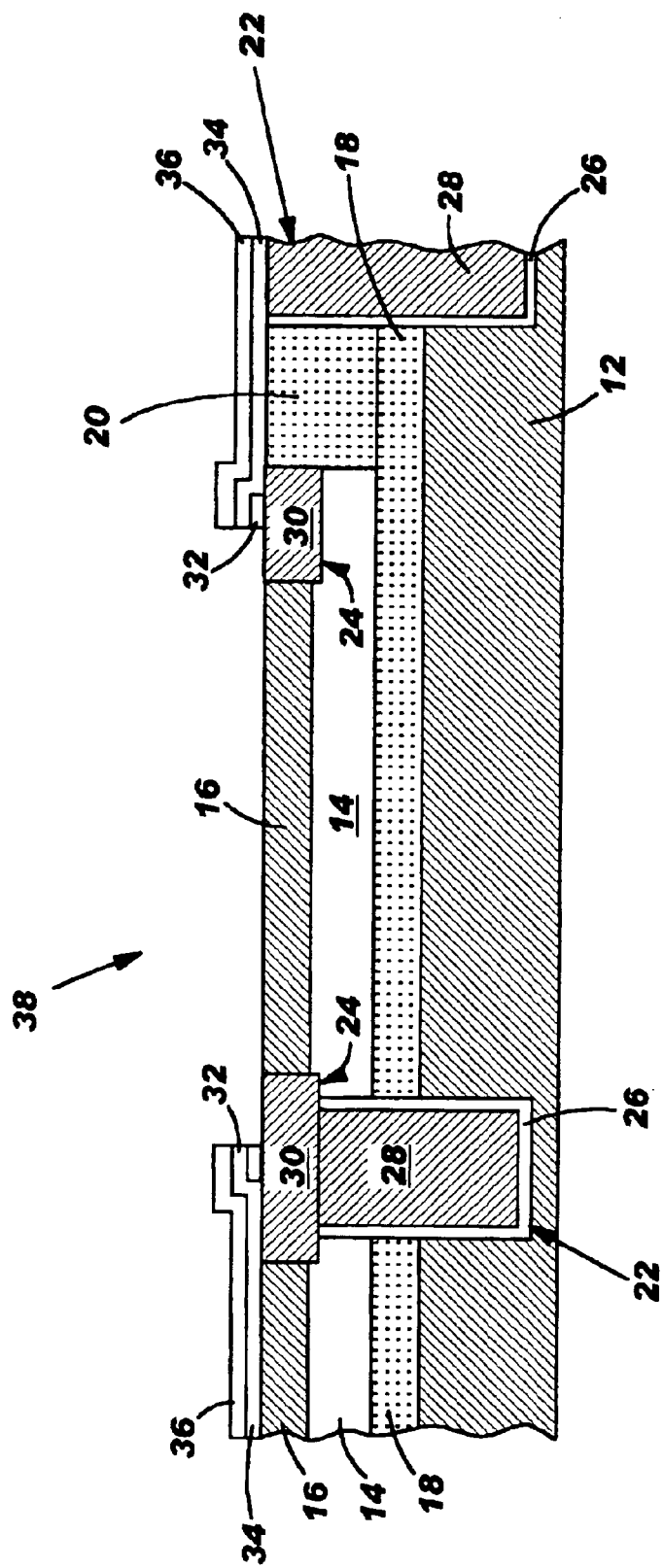

FIG. 1C shows the structure formed after the bipolar device region 100 has been protected with a patterned insulating layer 32. The patterned insulating layer 32, which is typically a nitride such as $Si_3N_4$, is formed by deposition, lithography (including resist application, exposure and development) and etching. At this point of the present invention conventional CMOS transistors such as field effect transistors (FETs) are formed in the CMOS device area. The CMOS transistor fabrication is well known to those skilled in the art therefore a detailed discussion is not provided herein.

Although not shown in FIG. 1C, the CMOS transistors will include source/drain regions and source/drain extension regions that are formed via ion implantation and annealing into the top Si-containing layer 16 of the SOI substrate 10. The region in the top Si-containing layer between the source and drain regions that underlies the gate serves as the CMOS device channel. Atop the channel is a gate dielectric/gate conductor stack which has at least one pair of isolation spacers on the exposed sidewalls of the gate dielectric/gate conductor stack. The gate dielectric is composed of an insulating material such as an oxide, nitride, oxynitride, high-k dielectric or any combination thereof. The gate conductor is composed of polysilicon, an elemental metal or an elemental metal alloy, a silicide or any combination thereof.

Following fabrication of the CMOS transistors, the CMOS transistor device area is protected with a protective layer 34. The protective layer 34 may be an oxide formed by a conventional deposition process or by a thermal oxidation process. A layer of amorphous polysilicon 36 is then applied atop the protective layer 34 by a deposition process such as CVD or plasma-assisted CVD. A photoresist mask (not shown) is applied to the amorphous polysilicon 36, and patterned utilizing a lithographic process. An opening (or window) 38 is then formed in the bipolar device region 100 by etching through the amorphous polysilicon layer 36, the protective layer 34 and nitride layer 32 stopping atop the upper surface of top Si-containing layer 16. The patterned photoresist is removed by a stripping process providing the structure shown, for example, in FIG. 1D. The opening is formed by a dry etching process such as RIE.

Figure 1E:
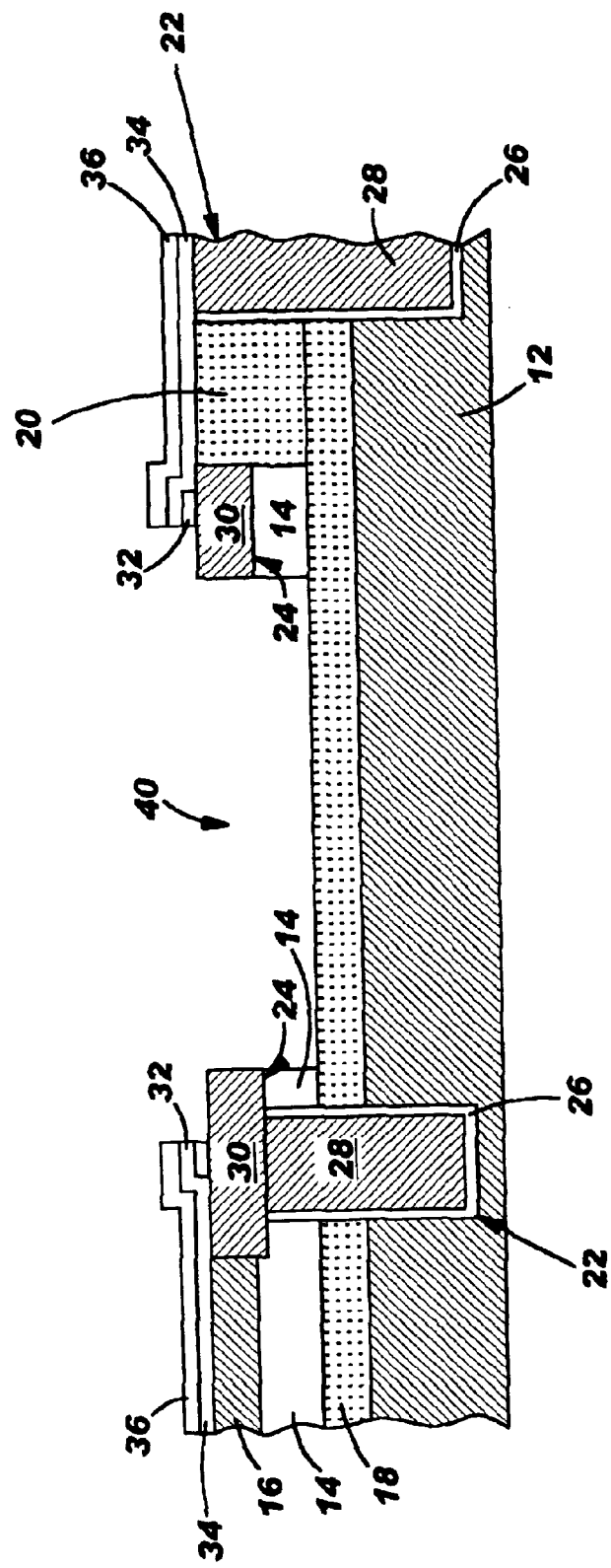
Figure 1F:
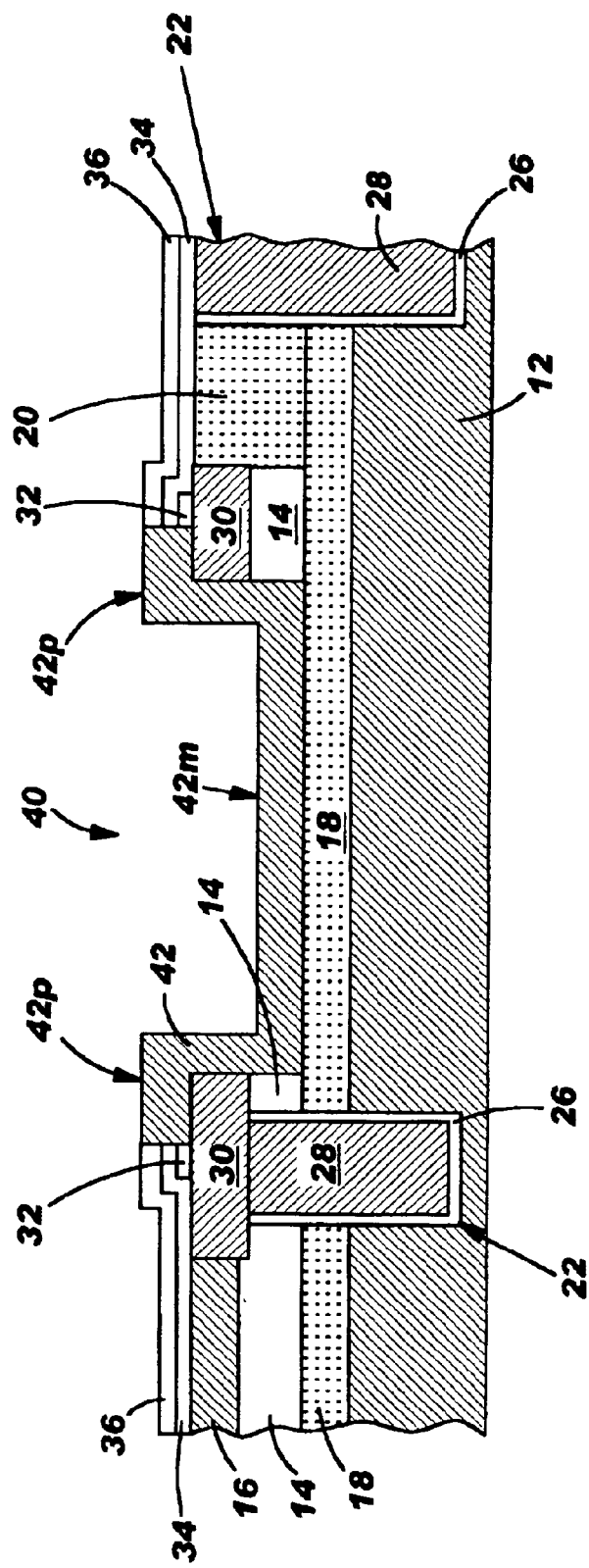

Next, and as shown in FIG. 1E, HBT device area is defined by selectively etching the exposed portions of the top Si-containing layer 16 and the underlying buried insulating layer 14, stopping atop an upper surface of the bottom Si-containing layer 12, i.e., stopping directly atop the sub-collector region 18. Specifically, the structure shown in FIG. 1E including HBT opening 40 is formed by first selectively etching the exposed top Si-containing layer 16 utilizing a reactive ion etch (RIE) process well known to those skilled in the art that is highly selective in removing silicon as compared to an insulator. The exposed buried insulating layer 14 is removed by a selective etching process in which a RIE process well known to those skilled in the art that is highly selective in removing an insulating material as compared to silicon is employed.

Next, base region 42 (see FIG. 1F) is formed on exposed surfaces of the structure (in the drawing the base region 42 is only shown in the opening 40) using a low temperature epitaxial growth process (typically 450°–700° C.). The base region 42, which may comprise Si, SiGe or a combination of Si and SiGe, is monocrystalline 42m on top of exposed portions of bottom Si-containing substrate 12 and polycrystalline 42p on top of the trench isolation regions. The region in which polycrystalline changes over to monocrystalline is referred to as the facet region. The base region 42 that is formed at this step of the present invention typically has a thickness after epitaxial growth of from about 300 to about 5000 Å. Note that the base region 42 is thicker atop the bottom Si-containing layer 12 than atop the isolation trench regions.

After forming the base region 42 of the bipolar transistor any number of processes well known to those skilled in the art can be used in forming the remaining portions of the HBT. This includes self-aligned processes such as disclosed, for example, in U.S. Pat. No. 6,492,238 to Ahlgern, et al. (the entire content of which is incorporated herein by reference) or non-self-aligned processes such as disclosed, for example, in co-pending and co-assigned U.S. application Ser. No. 10/249,821, filed May 9, 2003. The entire content of the aforementioned co-assigned and co-pending application is incorporated herein by reference.

Included within the HBT fabrication steps are:

1. Formation of a non-raised (not shown) or raised extrinsic base 44 over a patterned dielectric film stack. The raised extrinsic base, which is typically comprised of a doped Si, doped SiGe or a combination of doped Si and doped SiGe, is formed by an in-situ deposition process.

2. A patterned emitter isolation oxide 46 is formed atop the raised extrinsic base 44 by deposition and lithography.

3. An emitter opening is formed into the raised extrinsic base stopping atop the base region 42. The emitter opening is formed by lithography and etching.

4. One or more insulating spacers 48 may then be formed on the exposed sidewalls of the emitter opening.

5. An emitter polysilicon 50 is formed into the emitter opening by a conventional in-situ deposition process. The emitter polysilicon is then patterned by lithography and etching.

Figure 1G:
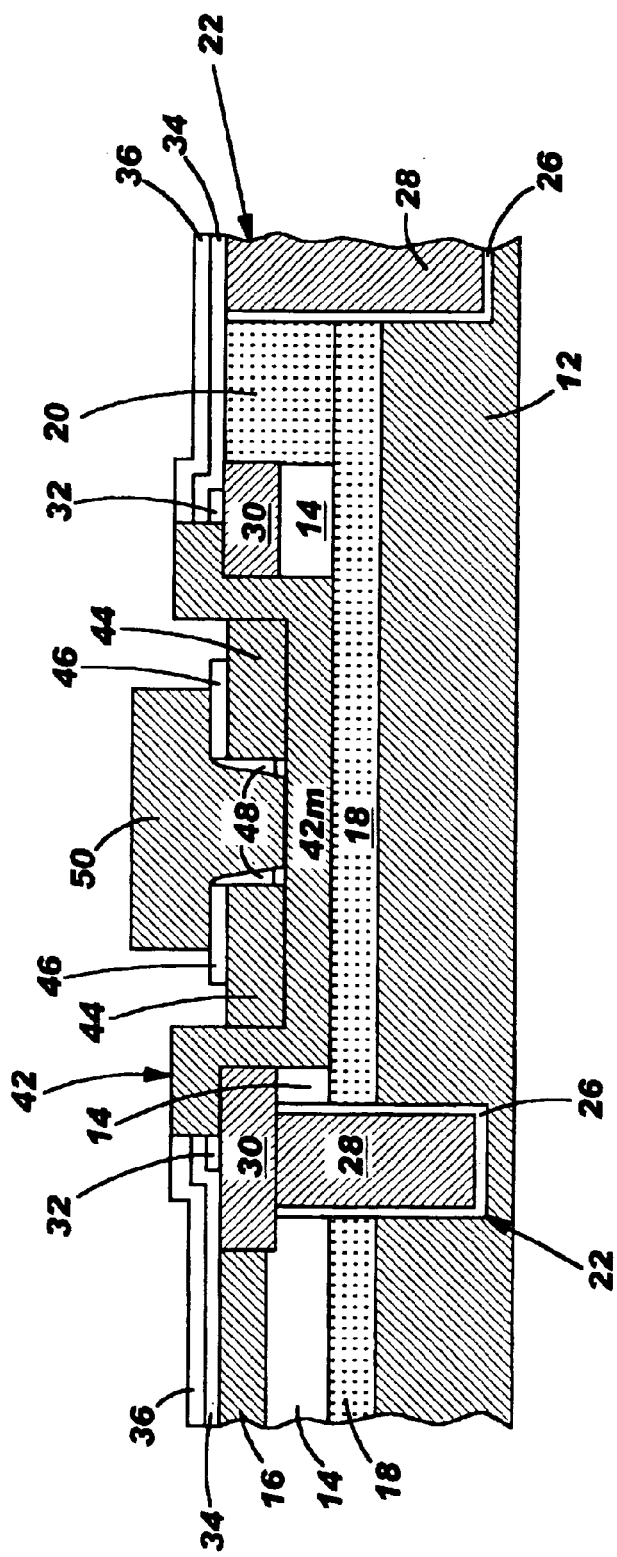

The above processing steps result in the general structure shown, for example, in FIG. 1G. The unlabeled regions under the insulating spacers represent an embodiment in which an emitter landing pad stack is employed. Although this general structure is shown, the present invention may be used to provide other HBT structures having other features that are not specifically shown herein. The HBT may be an npn bipolar transistor or a pnp bipolar transistor, with preference given to npn bipolar transistors.

FIG. 2 illustrates a BiCMOS structure that includes bipolar device region 100, CMOS device region 102 and passive device region 104. The bipolar device region 100 includes an HBT 110 (the elements of the HBT are the same as shown in FIG. 1G). In the CMOS device region 102, there is shown a FET 112 which includes source/drain regions 114, source/drain extension regions 116, channel (not labeled), gate dielectric 120, gate conductor 122, and isolation spacers 124.

The passive device region 104 includes a high-Q inductor 130 located atop SOI substrate 10. The inductor is typically formed using processing steps that are well known to those skilled in the art. In the passive device region 104, portions of the top Si-containing layer 16 and large portions of the bottom Si containing layer have been modified by implanting proton ions into the SOI substrate. The modified portion of SOI substrate 10, which has increased resistivity, is labeled as 132 in FIG. 2.

The increased resistivity portion of the SOI substrate 10 may be provided after the SOI substrate has been formed, after the structure shown in FIG. 1A is formed, or after the structure shown in FIG. 1B is formed. The proton ion implant step is carried out using a proton such as H$^+$ which is ion implanted into portions of the SOI substrate using a masked ion implantation process. The ion implantation process is performed using a proton ion dose of from about $10^{13}$ to about $10^{16}$ atoms/cm$^2$, an implant energy of from 100 to about 1,000 keV. Other implant conditions besides those mentioned above may be used in the present invention.

In another embodiment of the present invention, the bipolar device area 100 is defined during the formation of shallow trench isolation regions 24. In this embodiment the number of masking steps may be reduced.

Figure 3A:
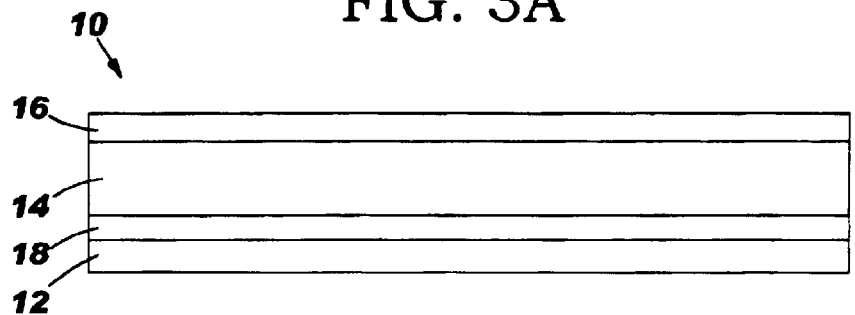

The method described in the second embodiment of the present invention begins with the initial structure shown in FIG. 3A. The initial structure comprises an SOI substrate 10, similar to the substrate depicted in FIG. 1A of the previous embodiment, including a bottom Si-containing layer 12, a buried insulating layer 14, such as an oxide, located atop the bottom Si-containing layer 12, and a top Si-containing layer 16 located atop the buried insulating layer 14.

A sub-collector 18 can be formed either during fabrication of the SOI substrate 10 or into the SOI substrate 10 utilizing implantation conditions that are capable of implanting p-type dopants into the SOI substrate 10 such that the upper surface of the sub-collector 18 abuts or is close to the lower surface of the buried insulating layer 14. In a preferred embodiment, the sub-collector 18 is a n-type sub-collector which has been formed by ion implanting an ntype dopant, such as arsenic, into the SOI substrate 10 using an ion dose of from about $10^{14}$ to about $10^{16}$ atoms/cm$^2$ and an implant energy of from about 50 to about 500 keV.

Figure 3B:
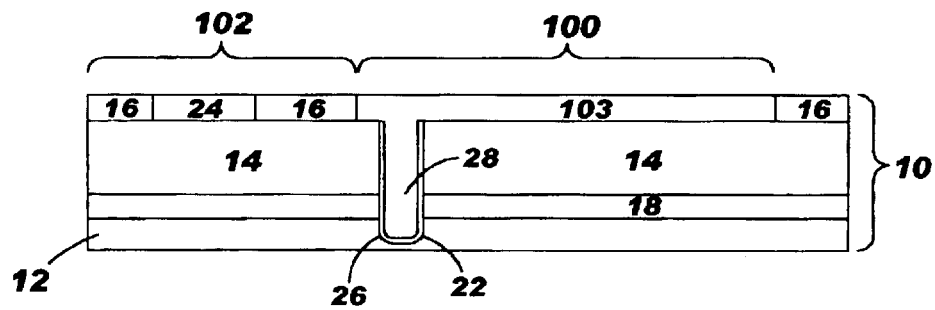

Referring now to FIG. 3B, in a next process step, isolation regions, such as shallow trench isolation (STI) regions 24 and optionally deep trench regions 22, are then formed to isolate the CMOS portion 102 of the SOI substrate 10, in which field effect transistors (FET) are subsequently formed, and to define the bipolar device region 100, in which the bipolar device is subsequently formed. Isolation regions may also separate the different types of subsequently formed field effect transistors (FET) within the CMOS device region 102. A passive device region, despite not being shown for the purposes of clarity, is also within the scope of the present invention and is incorporated herein. The passive device region would lay to the periphery of the bipolar device region 100 shown in FIGS. 3B–3M. Although a single bipolar device region 100 is shown, a plurality of such device regions can be present on the SOI substrate 10.

Shallow trench isolation (STI) regions 24 are typically formed using a patterned photoresist mask having a shallow trench pattern formed therein. Etching is employed to transfer the shallow trench pattern into the underlying Si-containing layer 16. Thereafter, the shallow trench isolation regions 24 are filled with a trench dielectric material, such as TEOS or a high-density-plasma (HDP) oxide. The shallow trench isolation regions 24 may be planarized to be coplanar with the remaining portion of the upper Si-containing layer 16.

In this embodiment, during shallow trench isolation (STI) 24 formation the upper Si-containing layer 16 is removed from the bipolar device region 100 of the SOI substrate 10. Removing the upper Si-containing layer 16 from the bipolar device region 100 of the SOI substrate 10 exposes the upper surface of the buried insulating layer 14. An insulating material 103, preferably being SiO$_2$, is then deposited atop the exposed portion of the buried insulating layer 14, defining the bipolar device region 100 of the SOI substrate 10. The insulating material 103 is planarized to be coplanar with the top surface of the remaining upper Si-containing layer 16 of the SOI substrate 10. The insulating material 103 that defines the bipolar device region 100 is hereafter referred to as a bipolar dielectric region 103.

Optionally, deep trench isolation regions 32 may also be formed. Similar to the deep trench isolation regions formed in the embodiment depicted in FIG. 1B, each deep trench 22 may be lined via deposition or oxidation with an oxide liner 26, such as tetraethylorthosilicate (TEOS), and filled with a trench fill material 28, such as undoped polySi.

Figure 3C:
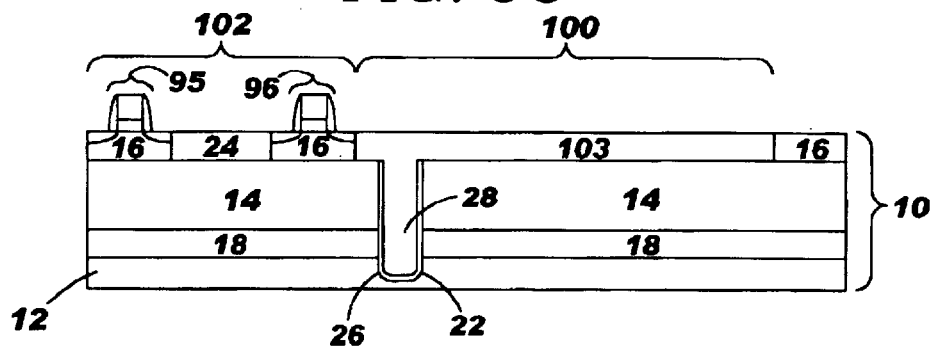

Referring to FIG. 3C, the field effect transistors (FET) 95, 96 are then formed within the CMOS device region 102 of the substrate 10. It is noted that the field effect transistors 95, 96 may be selectively processed to produce n-type 95 and p-type 96 devices using photoresist block masks. The FETs are built using conventional BiCMOS technology known to those skilled in the art.

Figure 3D:
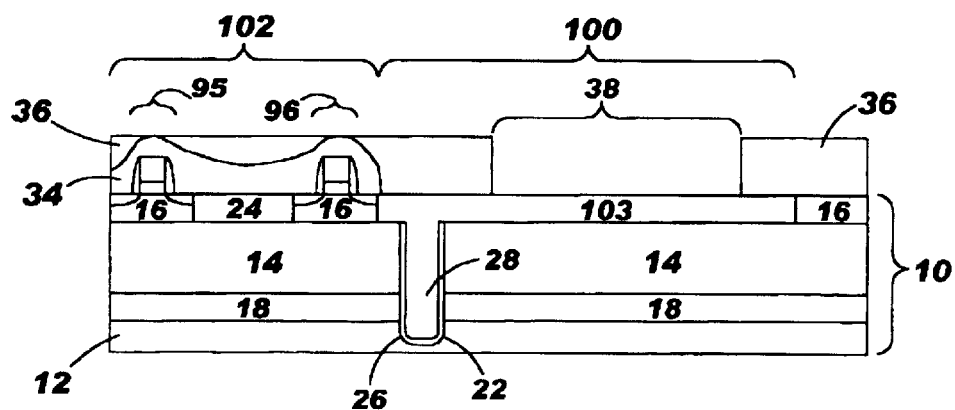

Referring to FIG. 3D, following the formation of the field effect transistors (FETs) 95, 96, the bipolar region 100 of the SOI substrate 10 is processed. First a protective layer 34 is formed atop the CMOS region 102 of the SOI substrate 10. The protective layer 34 may be an oxide, nitride, or oxynitride, preferably being $SiO_2$. The protective layer 34 may be deposited using deposition or thermal growth, such as plasma enhanced chemical vapor deposition or thermal chemical vapor deposition. Preferably, the protective layer 34 is a thermal oxide.

The protective layer 34 is then selectively etched to remove the protective layer 34 from the bipolar region 100 of the SOI substrate 10, where the remaining portion is positioned atop the CMOS region 102. Preferably, the etch process comprises an etch chemistry having a high selectivity to removing the protective layer 34 without substantially etching the underlying Si-containing layer 16.

A polysilicon layer 36 is then formed over the SOI substrate 10, including the bipolar device region 100 and CMOS device region 102. The polysilicon layer 36 can be deposited using conventional deposition processes including chemical vapor deposition. The polysilicon layer 36 may have a thickness on the order of approximately 500 Å. Following deposition, a polysilicon regrowth process is conducted at a temperature on the order of about 650° C. In a preferred embodiment, the polysilicon layer 36 comprises amorphous polysilicon.

Still referring to FIG. 3D, the polysilicon layer 36 is then opened to provide a window 38 exposing the bipolar dielectric region 103, in which a bipolar device is subsequently formed. Specifically, the polysilicon layer 36 is opened by an etch process, where a patterned hard mask functions as an etch mask. The patterned hardmask is formed by deposition, photolithography, and etching. The patterned hardmask may comprise dielectrics that can be deposited by chemical vapor deposition (CVD) and related methods. The patterned hardmask is preferably an oxide having a thickness on the order of about 500 Å.

Following the formation of the patterned hardmask, the polysilicon layer 36 is opened by etching the exposed portion of the polysilicon layer 36, where the hardmask functions as an etch mask. Preferably, the etch process is a directional etch process, such as reactive ion etch (RIE), having an etch chemistry that removes the polysilicon layer 36 selective to the bipolar dielectric region 103.

Figure 3E:
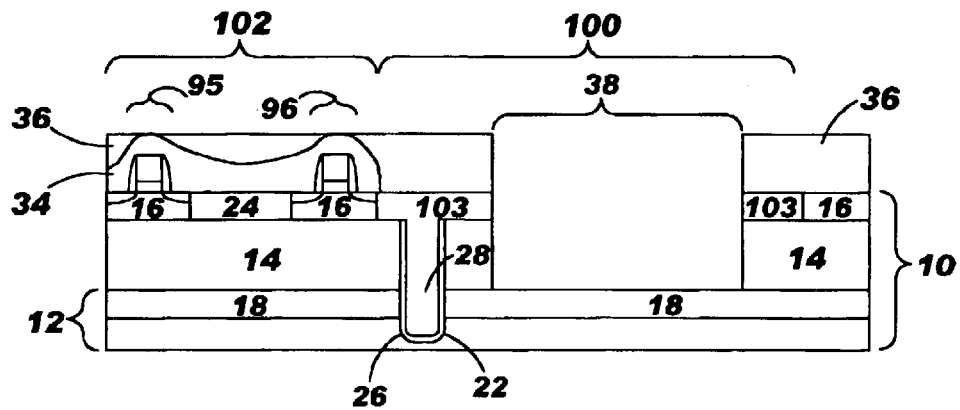

Referring to FIG. 3E, the bipolar dielectric region 103 is then etched selective to the polysilicon layer 36, where the opened polysilicon layer 36 functions as an etch mask. In a next process step, the portion of the buried insulating layer 14 within the bipolar device region 100 is etched selective to the opened polysilicon layer 36 stopping on the sub-collector 18 of the bottom Si-containing layer 12. During this process step the patterned oxide hard mask can be removed. The removal of material from the bipolar dielectric region 103 and the buried insulating layer 14 in the bipolar device region 100 provides an opening 38. The etch process utilized to etch the bipolar device region 103 and the buried insulating layer 14 is a directional etch process, such as reactive ion etching.

Figure 3F:
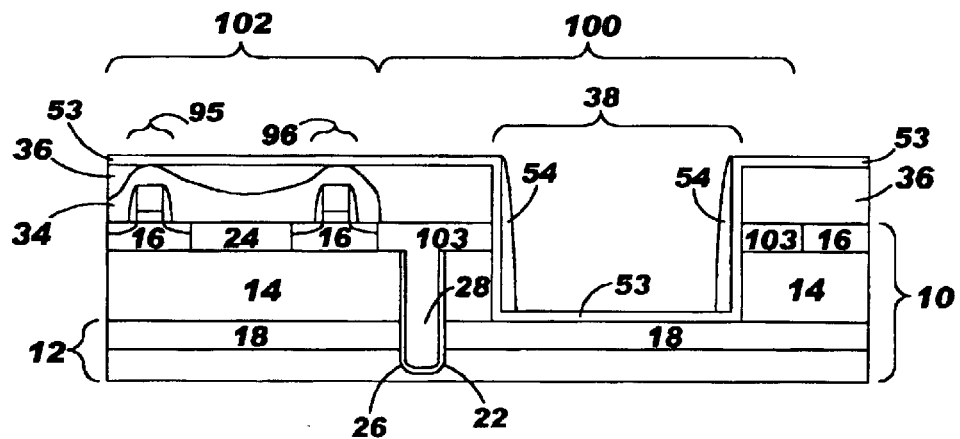

Referring to FIG. 3F, an oxide liner 53 is then conformally deposited atop the structure depicted in FIG. 3E, including within the opening 38 of the SOI substrate 10. The oxide liner 53 may be formed by high-pressure oxidation, by dry oxidation, or by thermal oxide deposition. The oxide liner 53 is preferably $SiO_2$ and may have a thickness ranging from about 5 nm to about 50 nm.

Still referring to FIG. 3F, sidewall spacers 54 are then formed along the sidewalls of the opening 38. The sidewall spacers 54 preferably comprise polysilicon, but may comprise other dielectric materials, such as oxides, nitrides and oxynitrides. The sidewall spacers 54 are formed by depositing the sidewall material by conventional deposition processes, such as chemical vapor deposition, and etching the sidewall material using conventional photolithography and etching. The sidewall spacers 54 can have a thickness ranging from about 5 nm to about 15 nm.

Figure 3G:
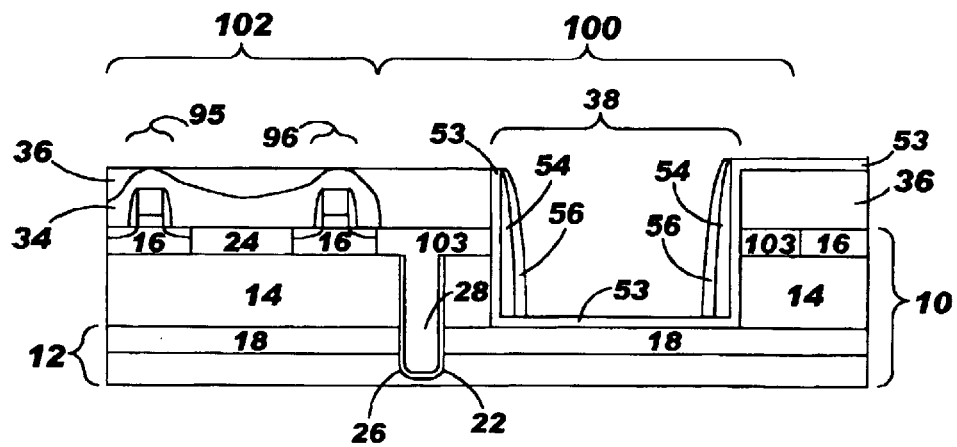

Alternatively, a double spacer arrangement may be utilized comprising a first sidewall spacer 55, preferably being a nitride, and a second sidewall spacer 56, preferably being polysilicon, as depicted in FIG. 3(G). Alternatively, any dielectric material may be utilized for the first sidewall spacer 55 including oxide, nitride, and oxynitride materials. The double sidewall spacer 55, 56 arrangement can reduce device leakage. The first sidewall spacer 55 may have a thickness ranging from about 5 nm to about 15 nm. The second sidewall spacer 56 may have a thickness ranging from about 10 nm to about 100 nm. It is noted that the above sidewall spacer thickness are given for illustrative purposes only and that other spacer thicknesses are contemplated herein. Although the following process steps depict a single spacer arrangement, a dual spacer arrangement is equally applicable.

Figure 3H:
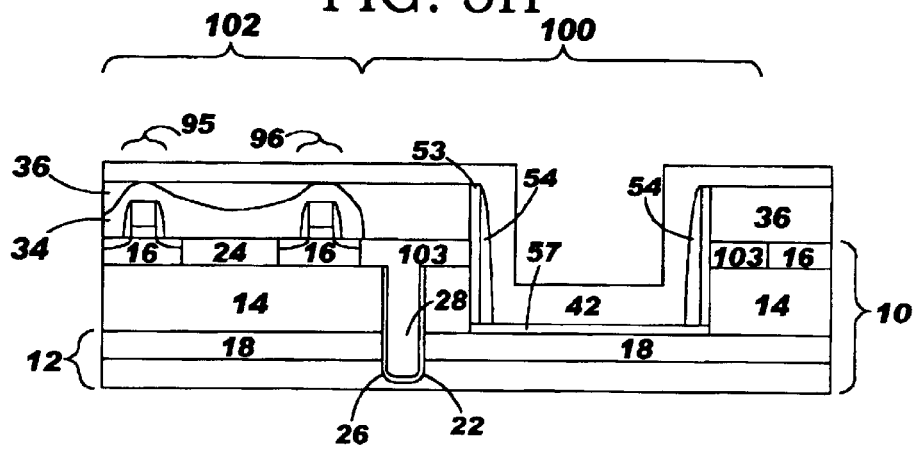

Referring to FIG. 3(H), following the formation of the spacers 54, the oxide liner 53 is stripped from the surface of the lower Si-containing layer 12, which contains the sub-collector 18. The oxide liner 53 can be stripped by a wet etch process that is selective to removing the oxide of the oxide liner 53 without etching the lower Si-containing layer 12 of the SOI substrate and the sidewall spacers 54.

Following this etching step, the surface of the lower Si-containing layer 12 and the spacers 54 are chemically cleaned to remove residual oxide and prepare the surfaces for epitaxial growth. The chemical clean compositions utilized to accomplish this include dilute HF; ammonium hydroxide-hydrogen peroxide; and hydrochloric acid-hydrogen peroxide. This clean insures the absolute cleanliness typically required for epitaxial growth. In addition to removing the exposed oxide, the cleaning composition also removes the portion of the oxide liner 53 that is positioned underlying the spacers 54.

An n-type doped epitaxially grown Si-containing layer 57 is then formed atop the lower silicon-containing layer 12, in which the sub-collector 18 is positioned. The n-type doped epitaxially grown Si-containing layer 57 functions as a portion of the sub-collector 18 for the bipolar device. Preferably, the epitaxially grown Si-containing layer 57 is formed using a low temperature epitaxial growth process, typically performed at a temperature ranging from about 450° C. to about 700° C. Thereafter, the epitaxial grown Si-containing layer 57 is doped with an n-type dopant. The dopant concentration is preferably limited to less than $10^{15}$ atoms/cm$^3$, preferably being less than $10^{14}$ atoms/cm$^3$. The n-type doped epitaxially grown Si-containing layer 57 has a thickness ranging from about 300 Å to about 5000 Å. Alternatively, the n-type doped epitaxially grown Si-containing layer 57 may be omitted.

Still referring to FIG. 3(H), following the formation of the n-type epitaxially grown Si-containing layer 57, a conformal p-type base layer 42 may be formed atop at least the n-type epitaxially grown Si-containing layer 57 by deposition process, such as chemical vapor deposition (CVD), plasma-assisted CVD, high-density chemical vapor deposition (HDCVD), and chemical solution deposition. The p-type base layer 42, which may comprise Si, SiGe or a combination of Si and SiGe, is monocrystalline. Preferably, the p-type base layer 42 comprises epitaxial silicon germanium (SiGe) grown using low temperature epitaxial growth processes, where the temperature may range from about 450° C. to about 700° C.

The preferred epitaxially grown p-type silicon germanium (SiGe) base layer 42 may have Ge concentration that is either continuously present or graded. The p-type dopant preferably comprises boron (B). Additionally, the p-type doped silicon germanium (SiGe) base layer 42 may further comprise carbon, where carbon is present to control out-diffusion of the base dopants.

The p-type base layer 42 may comprise a single layer or multiple layers and may have a thickness on the order of about 80 nm. Following the formation of the p-type base layer 42, conventional process steps may be utilized to provide the emitter region and electrical connectivity to the bipolar device. FIGS. 3I–3M represent process steps for illustrating one embodiment of the present invention.

Figure 3I:
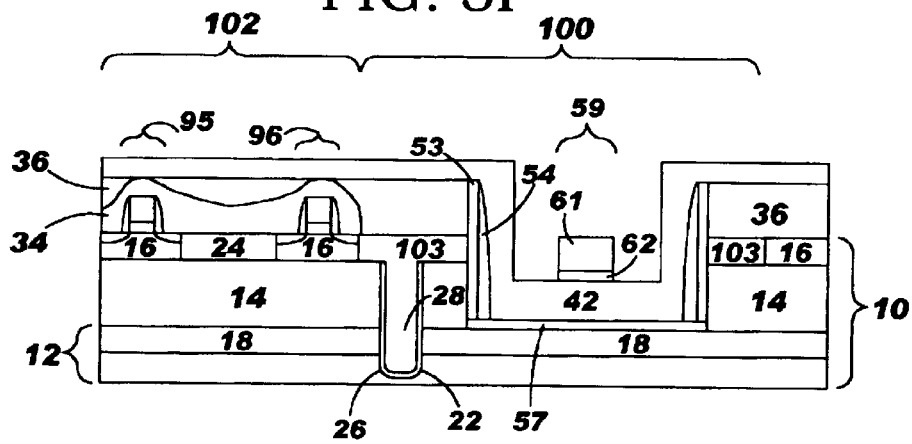

Referring to FIG. 3I, a sacrificial pedestal region 59 is formed atop the p-type base layer 42. The sacrificial pedestal region 59 comprises a polySi layer 61 atop an oxide etch stop layer 62 and can be formed by deposition, photolithography and etching. The oxide etch stop layer 62 preferably has a thickness on the order of about 10 nm.

Figure 3J:
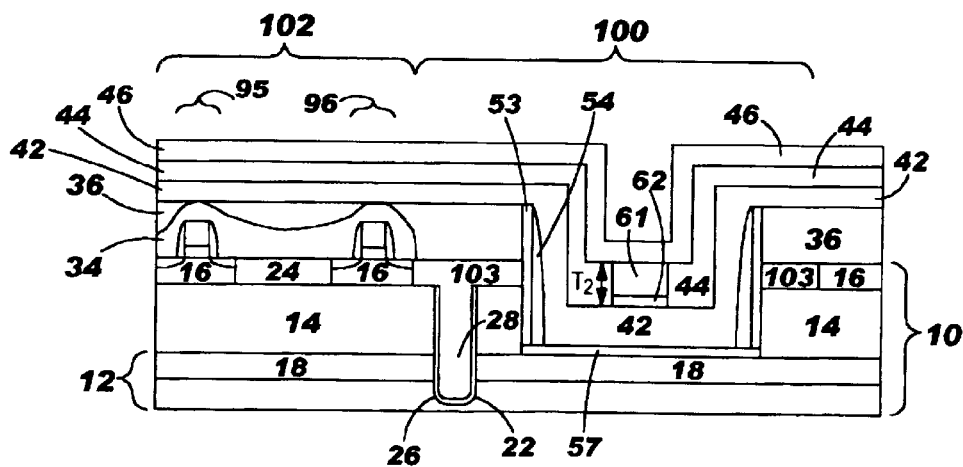

Referring to FIG. 3J, an extrinsic base layer 44 is then conformally deposited that will subsequently form extrinsic base regions. The extrinsic base layer 44 may be a highly-doped polysilicon or an amorphous silicon, which may be in-situ doped. The dopant type for the extrinsic base layer 44 may be the same conductivity type as the epitaxially grown p-type base layer 42. Typically, the thickness of the extrinsic base layer 44 is on the order of about 100 nm. In a next process step, an emitter isolation oxide 46 is conformally deposited atop the extrinsic base layer 44. The emitter isolation oxide 46 preferably comprises SiO$_2$, and has a thickness on the order of about 100 nm.

Referring to FIG. 3K, in a next process step a portion of the emitter isolation oxide 46 and the polysilicon layer 61 are removed using a directional etch process to form an emitter opening 63. In a preferred embodiment, a highly selective etch removes the oxide of the emitter oxide layer 46 without substantially etching the underlying polysilicon layer 61. Thereafter, a second highly selective etch removes the polysilicon layer 61, where the remaining oxide of the emitter isolation oxide layer 46 functions as an etch mask and the emitter isolation oxide layer 62 functions as an etch stop. Insulating spacers 48, preferably comprising Si$_3$N$_4$, are then formed abutting the emitter opening 63 sidewalls.

Referring to FIG. 3L, an emitter region 50 is then formed within the emitter opening 63, where electrical isolation between the emitter region 50 and the extrinsic base regions is ensured by the insulating spacers 48 and the emitter isolation oxide layer 46. Prior to the formation of the emitter region 50, the etch stop oxide layer 62 is opened to allow contact between the emitter region 50 and the p-type base layer 42. In a next process step, a conventional emitter dopant drive-in anneal can be conducted. Following emitter formation the extrinsic layer 44 and the p-type base layer 42 are etched to provide the base region and extrinsic base region of the device, as depicted in FIG. 3(L).

Referring to FIG. 3M, a layer of conventional dielectric material 67 is then blanket deposited atop the entire substrate and planarized. The deposited dielectric 67 is then patterned and etched to form an emitter contact via, collector contact via and base contact via. Following via formation, the emitter interconnect 69, the collector interconnect 70, and the base interconnect 68 is formed by depositing a conductive metal into the visa using conventional processing, such as CVD or plating.

Although not depicted, the embodiment depicted in FIG. 3A–3M may further comprise a passive device region including a high-Q inductor, similar to the passive device region 104 depicted in FIG. 2. The passive device region of the substrate 10 may be implanted with protons, such as H$^+$, to increase the resistivity of the portion of the substrate, on which an inductor may be formed.

The present invention combines the features of the state-of-art SOI CMOS technology and the state-of-art bulk-Si BiCMOS technology.

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. A method for fabricating a heterojunction bipolar transistor comprising:
   providing an SOI substrate comprising a bottom Si-containing layer, a buried insulating layer located atop the bottom Si-containing layer, a top Si-containing layer atop the buried insulating layer and a sub-collector which is formed in an upper surface of the bottom Si-containing layer, said sub-collector is in direct contact with a bottom surface of the buried insulating layer;
   selectively removing portions of the top Si-containing layer and the buried insulating layer stopping atop the sub-collector so to define an area for fabricating a heterojunction bipolar transistor; and
   forming an extrinsic base heterojunction bipolar transistor in said area in which a base region of the transistor is formed directly atop the sub-collector.

2. The method of claim 1 wherein the sub-collector is formed by ion implanting a dopant into said SOI substrate.

3. The method of claim 1 wherein the sub-collector is formed during said fabrication of an SOI substrate.

4. The method of claim 1 further comprising forming a region in said SOI substrate that is in contact with the sub-collector.

5. The method of claim 1 further comprising forming trench isolation regions in said SOI substrate prior to said selectively removing step.

6. The method of claim 5 wherein said trench isolation regions are selected from deep trench isolation regions, shallow trench isolation regions and a combination thereof.

7. The method of claim 1 wherein the selectively removing step comprises a first etching process that is highly selective in removing silicon as compared to an insulator and a second etching process that is highly selective in removing an insulator as compared to silicon.

8. The method of claim 1 wherein the base region of the bipolar transistor is formed by a low-temperature epitaxial growth process.

9. The method of claim 8 wherein said base region includes polycrystalline portions and monocrysytalline portions.

10. The method of claim 1 wherein the forming of the extrinsic base heterojunction bipolar transistor comprises a self-aligned process or a non-self aligned process.

11. The method of claim 1 wherein the forming of said extrinsic base heterojunction bipolar transistor comprises the steps of: forming an extrinsic base atop said base region; forming a patterned emitter isolation oxide atop portions of said extrinsic base; forming an emitter polysilicon in an emitter opening located in the extrinsic base; and patterning the emitter polysilicon.

12. The method of claim 1 further comprising subjecting portions of the SOI substrate that lay to the periphery of the extrinsic base heterojunction bipolar transistor to a proton ion implantation step, which increases resistivity of the SOI substrate.

13. The method of claim 12 further comprising forming an inductor over said region of increased resistivity.

14. A BiCMOS structure comprising:
an SOI substrate having a bottom Si-containing layer, a buried insulating layer located atop the bottom Si-containing layer, a top Si-containing layer atop the buried insulating layer and a sub-collector which is located in an upper surface of the bottom Si-containing layer, said sub-collector is in contact with or close to a bottom surface of the buried insulating layer; and
an extrinsic base heterojunction bipolar transistor located in an opening provided in a bipolar device area of the SOI substrate in which a base region of the bipolar transistor is located directly atop the sub-collector.

15. The BiCMOS structure of claim 14 further comprising at least one field effect transistor located adjacent to, but isolated from, the extrinsic base heterojunction bipolar transistor, said at least one field effect transistor is located within and atop the top Si-containing layer of the SOI substrate.

16. The BiCMOS structure of claim 14 further comprising at least one passive element located adjacent to, but isolated from, the extrinsic base heterojunction bipolar transistor, said at least one passive element is located atop areas of the SOI substrate having increased resistivity.

17. The BiCMOS structure of claim 14 wherein the base region is comprised of a polycrystalline portion and a monocrystalline portion.

18. The BiCMOS structure of claim 14 wherein the extrinsic base heterojunction bipolar transistor includes an extrinsic base that is comprised of a doped layer.

19. The BiCMOS structure of claim 14 wherein the extrinsic base heterojunction bipolar transistor includes an emitter polysilicon.

20. A method for fabricating a heterojunction bipolar transistor comprising:
providing an SOI substrate having a bottom Si-containing layer, a buried insulating layer located atop said bottom Si-containing layer, a top Si-containing layer atop said buried insulating layer and a sub-collector which is formed in an upper surface of said bottom Si-containing layer, said sub-collector is in direct contact with a bottom surface of the buried insulating layer;
selectively removing the top Si-containing layer from a portion of said SOI substrate to provide a bipolar opening;
depositing a bipolar dielectric within said bipolar opening, wherein said bipolar dielectric is positioned atop said buried insulating layer;
selectively removing portions of said bipolar dielectric and said buried insulating layer stopping atop said sub-collector so to define an area for fabricating a heterojunction bipolar transistor; and
forming an extrinsic base heterojunction bipolar transistor in said area in which a base region of the transistor is formed directly atop the sub-collector.

21. The method of claim 20 wherein said sub-collector is formed by ion implanting a dopant into said SOI substrate.

22. The method of claim 20 wherein the sub-collector is formed during the fabrication of an SOI substrate.

23. The method of claim 20 wherein following said selectively removing portions of said bipolar dielectric and said buried insulating layer, a conformal oxide liner is grown within said area for fabricating said heterojunction bipolar transistor.

24. The method of claim 23 further comprising forming at least one set of sidewall spacers atop said conformal oxide liner prior to forming said base region.

25. The method of claim 24 further comprising removing said conformal oxide liner from a top surface of said bottom Si-containing layer, wherein said removing said conformal oxide liner comprises etching said conformal oxide liner selective to said bottom Si-containing layer.

26. The method of claim 20 further comprising forming an n-type epitaxial silicon-containing layer atop said lower Si-containing layer within said area for fabricating said heterojunction bipolar transistor prior to forming said base region.

27. The method of claim 20 wherein the forming of the extrinsic base heterojunction bipolar transistor comprises the steps of: forming an extrinsic base atop the base region; forming a patterned emitter isolation oxide atop portions of the extrinsic base; forming an emitter polysilicon in an emitter opening located in the extrinsic base; and patterning the emitter polysilicon.

28. The method of claim 20 further comprising subjecting portions of the SOI substrate that lay to the periphery of the extrinsic base heterojunction bipolar transistor to a proton ion implantation step, which increases resistivity of the SOI substrate.

29. The method of claim 28 further comprising forming an inductor over said region of increased resistivity.

* * * * *